United States Patent [19]

Nawata et al.

[11] 4,157,561
[45] Jun. 5, 1979

[54] HIGH POWER TRANSISTOR

[75] Inventors: Yoshiaki Nawata, Yokohama; Masaaki Kobayashi; Kazuo Yajima, both of Kawasaki; Shigeo Iwasawa, Hayama; Koji Takahashi, Kamakura, all of Japan

[73] Assignee: Fujitsu Limited, Japan

[21] Appl. No.: 837,303

[22] Filed: Sep. 27, 1977

[30] Foreign Application Priority Data

Oct. 27, 1976 [JP] Japan .................. 51-128927

[51] Int. Cl.$^2$ ............................... H01L 29/72
[52] U.S. Cl. ........................ 357/36; 357/34; 357/45; 357/55; 357/68
[58] Field of Search .......... 357/36, 34, 55, 68, 357/45

[56] References Cited
U.S. PATENT DOCUMENTS 3,997,910  12/1976  Einthoven ............... 357/68

*Primary Examiner*—Edward J. Wojciechowicz
*Attorney, Agent, or Firm*—Staas & Halsey

[57] ABSTRACT

This invention relates to a high power bipolar transistor comprising a collector region, a base region formed in the collector region and emitter regions formed in the base region, with each of the emitter regions being a closed loop at the surface of the base region. The emitter electrode contact region is arranged at the surface of base region and surrounded by the emitter region, and the emitter electrode contact region and emitter region are connected by a conductive area, with the conductive area being shallower than the emitter region. In addition, the conductive area is connected to the internal surface of the emitter region at one or more points but is not connected to the entire part of the internal surface of the emitter region.

By such a configuration, a current generated by the internal voltage due to remaining injection carriers, (particularly during the turn-off period), flows through the internal surface of the emitter region in an essentially uniform fashion, thereby preventing secondary breakdown of the transistor.

6 Claims, 11 Drawing Figures

PRIOR ART

PRIOR ART

FIG. 4b.

PRIOR ART

HIGH POWER TRANSISTOR

BACKGROUND OF THE INVENTION

1. Field of the Invention

This invention relates to a transistor, particularly to the structural configuration of a high power bipolar transistor.

2. Description of Prior Art

A bipolar transistor comprises a collector region having a first conductivity, a base region having the opposite conductivity and formed in the collector region and at least one emitter region formed in the base region, with electrodes being arranged on their respective region surfaces.

In such a transistor, the emitter region is generally formed in the base region in the form of island at a uniform depth and the electrode is formed and connected at almost the center of the surface.

When the transistor having such configuration is in ON state, wherein the forward bias is being applied between emitter and base, carriers are injected from the base to the emitter and are dispersed to the adjacent areas of the emitter region. However, when zero bias or back bias is applied to the emitter-base junction, (namely, the transistor biased in its OFF state), residual carriers are generated under the emitter region and by this influence, current is concentrated almost at the center of said emitter region and secondary breakdown results.

In general, in the case of power transistors, called overlay type transistors, wherein a plurality of emitter regions are formed in one base region and said emitter regions are connected in parallel by means of the metal electrode, the above-mentioned problems occur in each emitter region.

For this reason, it was very difficult to form such a high power transistor with the existing emitter configuration.

Moreover, in U.S. Pat. No. 3,427,511, a configuration of a transistor is shown, wherein the active emitter region is formed in the base region in the form of a ring, thus reducing the aforementioned incidence of secondary breakdown. In the configuration shown in this patent, the higher resistivity region is formed at the entire surface of the base region surrounded by the ring type active emitter region, and to which the emitter electrode is arranged and connected.

Even in this configuration, resistance of the base region under the emitter region is high due to the existence of a higher resistivity region on the entire surface, and therefore residual carriers are generated, thereby making the occurrence of secondary breakdown likely.

SUMMARY OF THE INVENTION

This invention relates to a bipolar transistor which comprises a collector region having a first conductivity, a base region having the opposite conductivity formed in said collector region and a plurality of emitter regions having the first conductivity and formed in said base region. In particular, the plurality of said emitter regions are formed into a closed ring-like loop at the surface of the base region and moreover the emitter electrode contact region is arranged at the surface of the base region surrounded by said emitter region. Said emitter electrode contact region and the emitter region are connected via a conductive area. Said conductive area is shallower than the emitter region. In addition, said conductive area comes in contact with the internal surface of the emitter region at at least one point, but is not connected to the entire part of the internal surface of the emitter region.

As described above, the emitter region is formed into a closed loop. Moreover, since the emitter electrode contact is connected to a part of the internal surface of said emitter region via the conductive area, at least a part of the base region is led out to the inside of said emitter region in the form of a closed loop. The resistance of this led out base region is sufficiently low and the resulting current generated by internal voltages based on the residual injection carriers is distributed almost equally to the entire part of the internal surface of the emitter region during turn-off. Thus, current is not concentrated at a particular area of said emitter region during turn-off and secondary breakdown of the transistor can be prevented.

The transistor by this invention having such emitter configuration allows several emitter regions, as mentioned above, to be formed in one base region. These emitters are connected in parallel to the metal electrodes connecting each emitter electrode region at the respective emitter electrode contact region.

Namely, this invention discloses such a configuration as being equal to that wherein many transistors are connected in parallel in one transistor chip, thereby a high power transistor can easily be obtained.

DESCRIPTION OF THE PREFERRED EMBODIMENTS

This invention relates to a transistor having a configuration which prevents secondary breakdown from occurring in the emitter region during the ON-OFF switching operation.

Recently, various attempts have been made in order to obtain transistors having increased capability with regard to the handling of large currents and high output powers.

When a transistor is used in a switching circuit, the operating state is shifted from the saturated area with a forward bias between the emitter and base to the cut-off area with a zero or back bias applied between the emitter and base. During this shifting period, the distribution of the current injected from the emitter region changes from that shown in FIG. 1a to FIG. 1b to FIG. 1c.

In FIGS. 1a–1c, 11 is an N type collector region, for example; 12, a P type base region with equal depth; 13, an N type emitter region with equal depth; 14, a base electrode; 15 an emitter electrode; 16, an insulation film; 17, a current region formed when the carrier electrons are injected to the base from emitter; and 18, the internal base resistance.

Figure 1A:
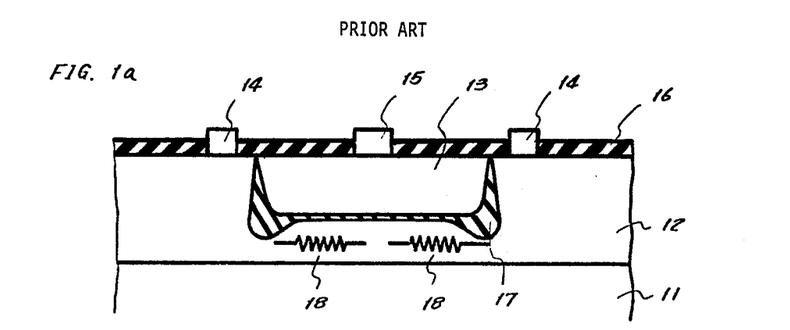
FIGS. 1a to 1c show sectional views of the rough configuration of a general planar type bipolar transistor which is well known in the art with the superimposed operating current distribution.

First, a forward bias is applied between the emitter and base, and the current generated by carrier injection from the emitter region 13 to the base region 12 during operation in the saturated region is concentrated at the circumference of the emitter region 13 and the area near to the base electrode 14 because of the base resistance 18 as shown in FIG. 1a.

Figure 1B:
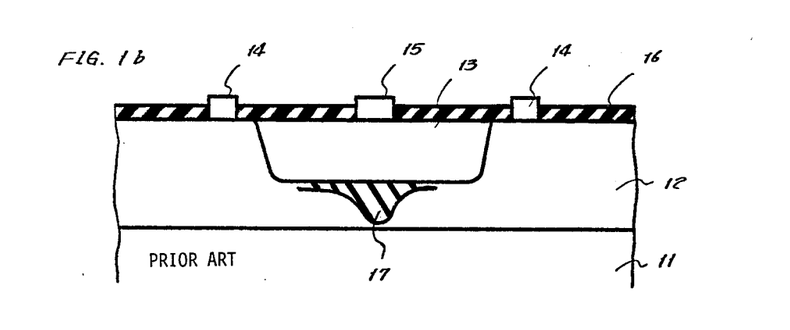

On the other hand, when zero or back bias is applied between the emitter and base causing the operation of the transistor to be shifted from the saturated region to the cut-off region, the current flows in a concentrated fashion through the emitter region 13 just below the emitter electrode 15 as shown in FIG. 1b since a large voltage difference is generated between the center and outside of the emitter region 13 due to existence of said base resistance 18 and residual injected carriers.

Figure 1C:
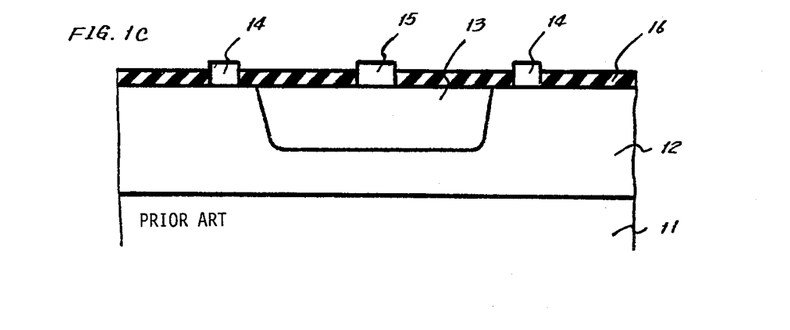

Subsequently, as shown in FIG. 1c, when operation has shifted to the cut-off region, the current does not flow.

Therefore, particularly in the transition period from the saturated region to the cut-off region, the emitter current is concentrated in the narrow area of the emitter region (base region of the emitter and base junction) just below the emitter electrode and therefore current density increases. Accordingly, secondary breakdown is likely to occur and such secondary breakdown will bring about the physical breakdown of the transistor.

This invention eliminates this disadvantage which the prior art transistors have and the object of this invention is to offer a transistor having such a configuration that secondary breakdown will never occur during the switching operation.

Offered according to this invention is such a transistor comprising a collector region having a first conductivity, a base region having the opposite conductivity formed in said collector region and an emitter region having the first conductivity formed in said base region, characterized in that said emitter region has a closed loop configuration at the surface of the base region, an emitter electrode contact region is arranged in the base region surrounded by said emitter region, and said emitter region and emitter electrode contact region are connected by a conductive area which comes in contact with the internal surface of said emitter region at at least one point but does not come in contact with the entire part of the internal surface of said emitter region.

Attention has been given to the center of the emitter region which plays only a small role in the operation of the transistor which said transistor is operating with a large current in its ON state, and it has therefore been determined that the center of said emitter region may be removed (in other words, the emitter region may be hollowed out without materially effecting its operation). For this reason, the emitter region is formed as the closed loop at the surface of the base region. The emitter region is moreover connected to the emitter electrode contact region at the inside of the surface of the base region separated via the conductive area, which is shallower than said emitter region, and, in addition, the depth of said emitter electrode contact region is also shallower than that of the emitter region. Furthermore, the base electrode is arranged on the other region, namely, at the outside of the base region surface separated by said conductive area.

Figure 2A:
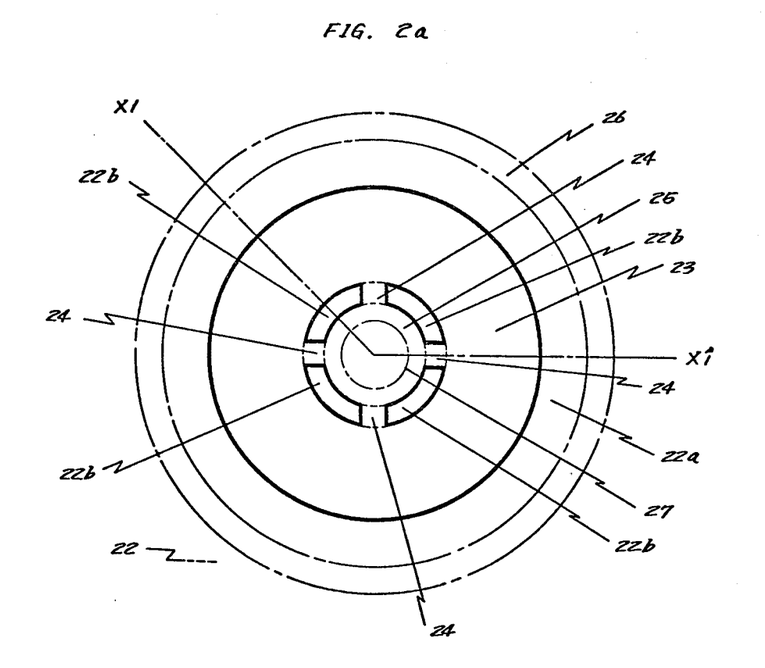
FIG. 2a shows the basic configuration of a transistor in accordance with this invention and FIG. 2b is the sectional view of FIG. 2a taken along the line $X_1$-$X_1'$.
Figure 2B:
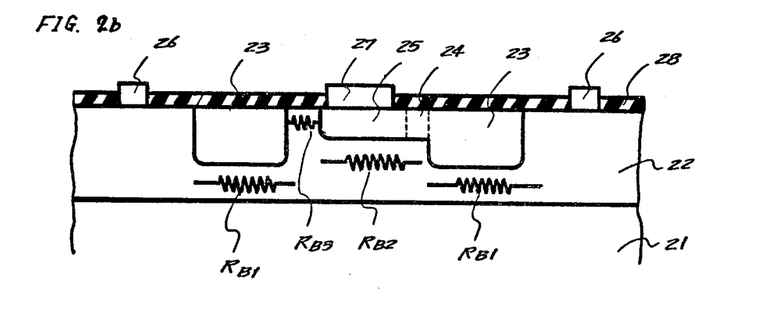

FIG. 2a shows the basic configuration of a transistor in accordance with this invention. FIG. 2b is the sectional view along the line $X_1$-$X_1'$ of the plan view shown in FIG. 2a. In FIG. 2, 21 represents a collector region having a first conductivity; 22, a base region with the opposite conductivity formed in said collector region 21; 23, an emitter region with a first conductivity formed in the base region 22; 24, a conductive area connected to the emitter region 23; 25, an emitter electrode contact region provided at the end of said conductive area 24; 26, a base electrode; 27, an emitter electrode; and 28, an insulation film. The emitter region 23 is provided in the form of a closed loop just like a ring at the surface of the base region, dividing the surface of base region 22 into two parts (22a, 22b).

Figure 5A:
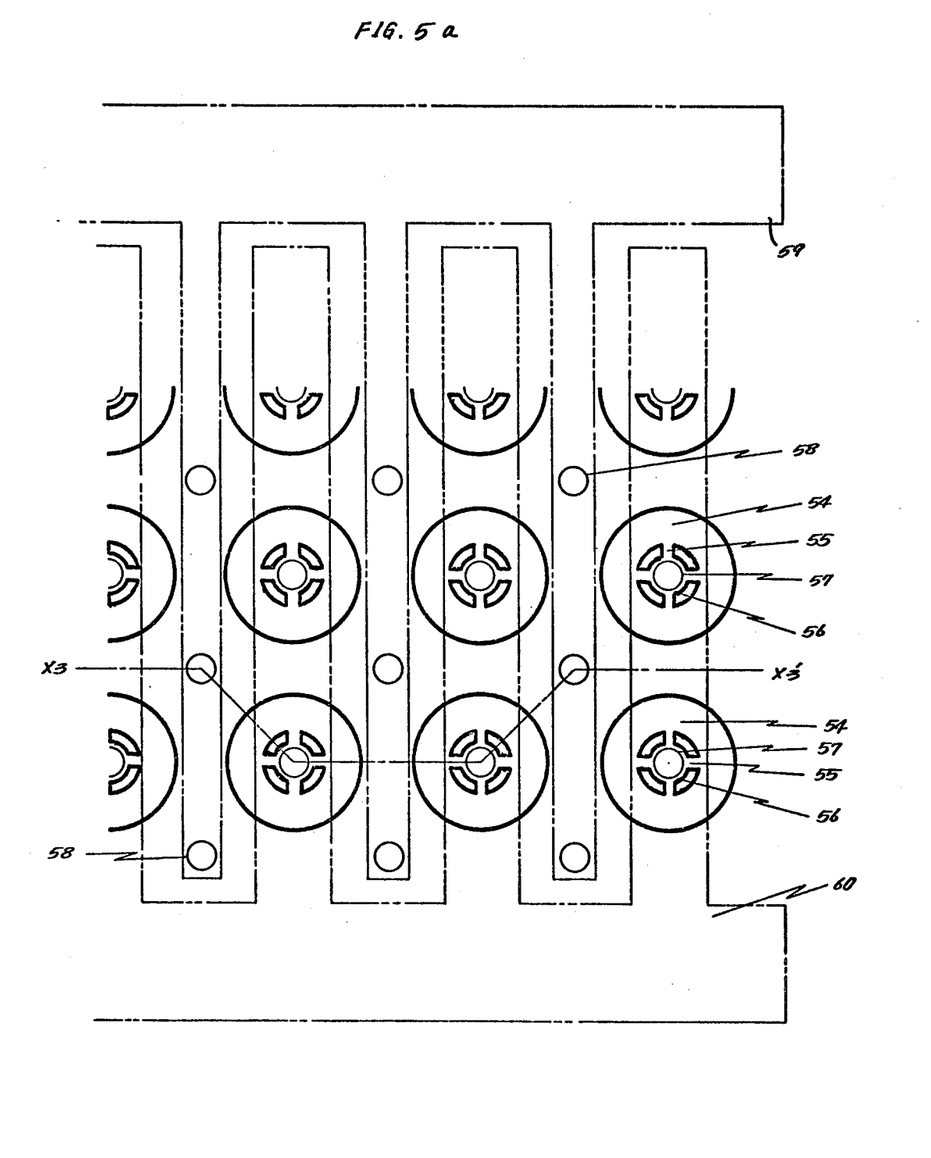
FIG. 5a shows the configuration in the mounting side of a transistor in accordance with this invention and FIG. 5b is the sectional view of FIG. 5a taken along the line $X_3$-$X_3'$.

The base electrode 26 is separated from the emitter region 23 by one surface 22a of the base region 22. For example, the surface of the base region 22a is in the form of a ring surrounding said emitter region 23. The base electrode is not limited to the ring form shown in FIG. 2, and it can be formed point by point as disclosed with regard to the embodiment described later and illustrated in FIG. 5. Furthermore, the conductive area 24 and emitter electrode contact region 25 are formed in the base region 22b surrounded by the emitter region 23. Here, the conductive area 24 and emitter electrode contact region 25 have the same conductivity as the emitter region 23 and are shallower than the emitter region with the conductive area operating as the stabilizing resistor of the emitter region while the transistor is forward-biased.

It should be noted that the conductive area 24 which conductively connects the emitter region 23 and emitter electrode contact region 25 is not connected at the entire part of the internal surface of the emitter region 23 and the base region 22b is led out to the inside of the emitter region 23.

According to the above-mentioned configuration and as illustrated in FIG. 2b, the base resistor is divided at least into the resistor $R_{B1}$ of the base region just below the emitter region 23, the resistor $R_{B2}$ in the base region surrounded by the emitter region 23 located in the conductive area 24 and emitter electrode contact region 25, and the resistor $R_{B3}$ of the region surrounded by the emitter region 24 and exposed at its surface.

Here, $R_{B2} >> R_{B3}$ because of the difference in thickness of the base region. Therefore, when the transistor is switched from the operating region to the cut-off region, almost all of the base current flows along the area with the small resistance, namely, at the area where the base region 22b is led out.

When the base region is formed by the ordinary impurity diffusion method, the distribution of impurities in accordance with the diffusion complies with the Gaussian distribution and the impurity concentration increases as one approaches the surface. Therefore, the trend of $R_{B2} >> R_{B3}$ becomes more distinctive. The base resistance $R_{B3}$ at the exposed area is very small causing the voltage drop at this area to be very small. Therefore, the voltages at the areas just below the internal surface of the emitter region, the conductive area and the emitter electrode contact region are almost the same when the transistor is switched from the operating region to the cut-off region. As a result of this, the current flowing through the adjacent area of the emitter region 23, when the transistor switches from the operating region to the cut-off region, is thus distributed to the side lower part of the emitter electrode contact region 25 of said emitter region 23 and the areas just below the conductive area 24 and emitter electrode contact region 25.

Figure 3:
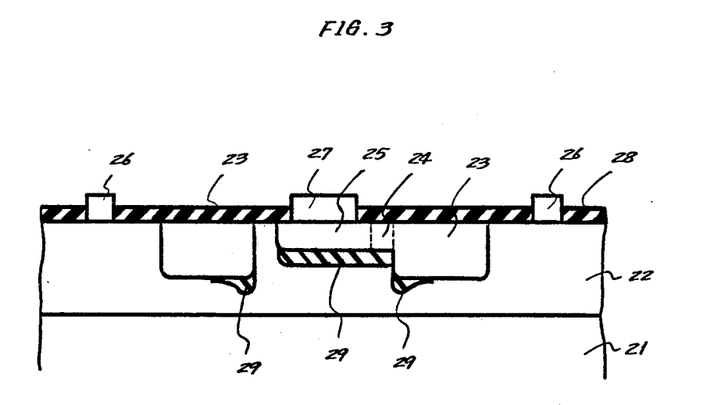
FIG. 3 is a drawing indicating current distribution of a transistor in accordance with this invention at the time of turn-off. This figure is also the sectional view of FIG. 2a along the line $X_1$-$X_1'$ as in the case of FIG. 2b.

FIG. 3 shows such a current distribution at the section along the line $X_1-X_1'$ of said FIG. 2 with the areas indicated by numeral 29 being the current region.

Thus, the secondary breakdown due to current concentration at the area just below the emitter electrode contact region which is generated in the case of the prior art configurations described above can be prevented.

In order to form the above-mentioned configuration, the existing manufacturing technique of planar transistors can be introduced.

U.S. Pat. No. 3,427,511 discloses a transistor configuration wherein a unit emitter region having the form of a closed loop is provided at the surface of the base region, with impurities of the same conductivity as the aforementioned emitter being introduced shallower than the emitter region and with a lower concentration than it at the emitter surface of the base region surrounded by the emitter region, thus the areas corresponding to said conductive area and emitter electrode contact region are formed as described above with regard to the present invention.

Figure 4A:
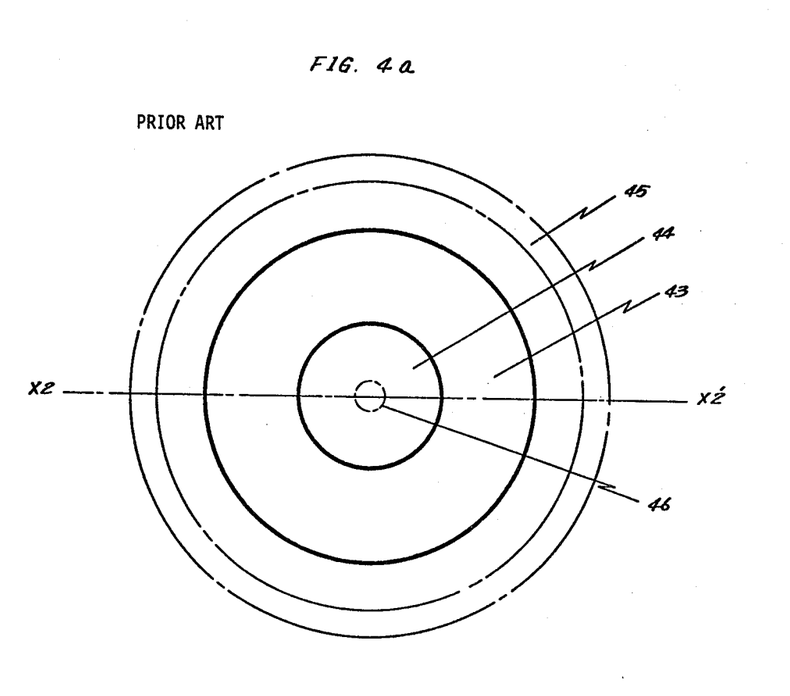
FIG. 4a shows a configuration of well known planar type transistor and FIG. 4b shows the sectional view of FIG. 4a taken along the line $X_2$-$X_2'$.
Figure 4B:
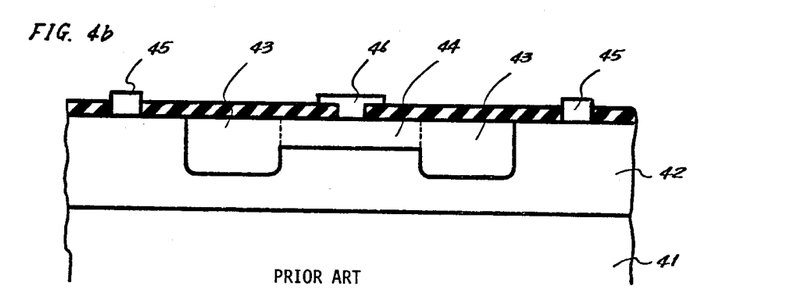

FIG. 4b shows the sectional view of FIG. 4 along the line $X_2-X_2'$. In this figure, 41 represents the collector region having a first conductivity; 42, a base region having the opposite conductivity and formed in the aforementioned collector region 41; 43, an emitter region having a first conductivity and formed in the aforementioned base region 42; 44, a high resistive region connected to the entire part of the internal surface of the emitter region 43 mentioned above; 45, a base electrode; 46, an emitter electrode; 47, an insulation film.

In such a configuration, however, since the high resistivity region is formed at the entire surface of the base region surrounded by the emitter region, the resistance at the area just below such region is large and the current is concentrated at the area just below the emitter electrode when switching is carried out from the saturated region to cut-off region during the switching operation.

As an example of a transistor constructed in accordance with this invention, a silicon NPN type transistor having the basic configuration as shown in FIG. 2 has been manufactured.

At first, the N type layer with an impurity concentration of $1 \times 10^{14}$(atoms/cm$^3$) is formed by the well known epitaxial growth method on an N type silicon substrate with an impurity concentration of $2 \times 10^{19}$(atoms/cm$^3$). The N type silicon substrate and N type layer form the collector region of the transistor. Then, a P type base region is formed on said N type layer with a surface impurity concentration of $1 \times 10^{18}$(atoms/cm$^3$) and a depth of 5($\mu$). In addition, three hundred ring shape N type emitter regions having a configuration in accordance with this invention are arranged on said base region. Each of the N type emitter regions has a surface impurity concentration of $5 \times 10^{20}$(atoms/cm$^3$) and a depth of 3($\mu$). Moreover, both the N type conductive area and N type emitter electrode contact region have a surface impurity concentration of $7 \times 10^{19}$(atoms/cm$^3$) and a depth of 1.5($\mu$).

The emitter region is formed into a ring on the base region surface with an internal diameter of 60($\mu\phi$) and an outer diameter of 140($\mu\phi$), while the emitter electrode contact region is formed into a circle with a diameter of 40($\mu\phi$), with the two regions arranged concentrically.

The emitter region and the emitter electrode contact region arranged on the inside of the emitter region are connected with the conductive area arranged in the directions providing a difference of 90 degrees and having a width of 10($\mu$).

As explained above, the emitter electrode contact region and conductive area are of the same conductivity, the same impurity concentration and the same depth and therefore they can be formed at one time with a single impurity diffusion treatment.

By the well known method, the electrode consisting of aluminum (Al) is formed on the semiconductor substrate surface having such an emitter configuration, thus a transistor is formed wherein all of the emitter regions are connected in parallel, and in such configuration, a 5 ohm resistor is inserted between the emitter electrode contact region and emitter region at each emitter.

Figure 5B:
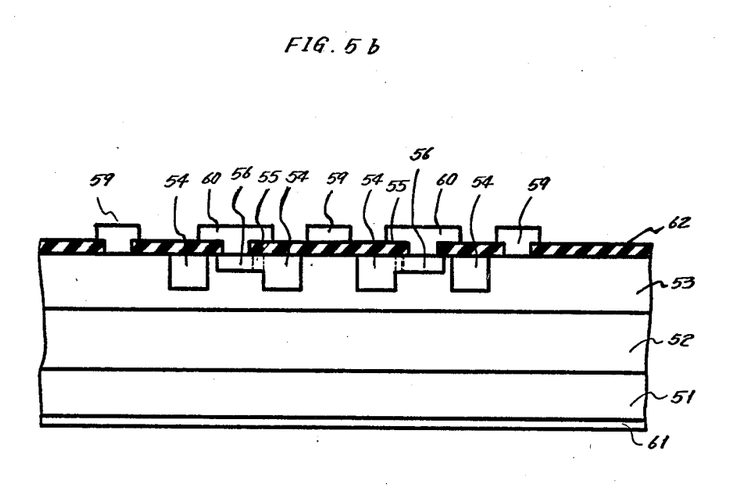

The configuration of this transistor is shown in FIG. 5. FIG. 5b shows the sectional view of FIG. 5a along the line $X_3-X_3'$. In this figure, 51 represents the N$^+$ type silicon substrate; 52, the N type epitaxial layer, 53, the P type base region; 54, the N$^+$ type emitter region; 55, the conductive area; 56, the emitter electrode contact region; 57, the emitter contact window; 58, the base contact region; 59, the base electrode; 60, the emitter electrode; 61, the collector electrode; 62, the insulating film. In such a configuration, each emitter electrode of a comb type is connected to ten emitters. Each base electrode of a comb type is connected to the base region 53 via the base contact region 58 which is arranged in plural between emitter regions 54.

On the other hand, for comparison purposes, a prior art NPN silicon transistor having the emitter configuration as shown in FIG. 4 has been manufactured.

In the case of this transistor, an N type layer having an impurity concentration of $1 \times 10^{14}$(atoms/cm$^3$) is formed on an N type silicon substrate having an impurity concentration of $2 \times 10^{19}$(atoms/cm$^3$) as in the case of the transistor of this invention. Then, a P type base region is formed on the N type layer having a surface impurity concentration of $1 \times 10^{18}$(atoms/cm$^3$) and a depth of 5($\mu$). Moreover, three hundred ring shape N type emitter regions having the configuration as shown in FIG. 4 are arranged.

The surface impurity concentration of the N type emitter region is $5 \times 10^{20}$(atoms/cm$^3$) and its depth is 3($\mu$).

In addition, the higher resistivity region is formed on the entire surface of the base region surrounded by said emitter region, with a surface impurity concentration of $7 \times 10^{19}$(atoms/cm$^3$) and a depth of 1.5($\mu$).

The emitter region is formed into a ring with an internal diameter of 60 ($\mu\phi$) and an outer diameter of 140($\mu\phi$) and as described above, the entire part of the base region surface on the inside is considered as the N type higher resistivity region. Moreover, the emitter electrode contact region having a 12($\mu\phi$) diameter is formed at the center of the higher resistivity region.

At the surface of the semiconductor substrate having such an emitter configuration, the electrode is formed by the well known method and a transistor is thereby constructed such that each emitter region is connected in parallel as in the case of the transistor constructed in accordance to this invention and described above; and with such a configuration, a 5.12 ohm resistor is inserted between the emitter electrode contact region and emitter region in each emitter.

The reason why the diameter of the emitter electrode contact region of the prior art transistor is chosen to be $12(\mu\phi)$ is that it is necessary to perform measurements and comparisons under the operating condition where resistances to the emitter region from the emitter electrode contact region of the transistor in accordance with this invention and the prior art transistor are made almost equal (5 ohm and 5.12 ohm) and thereby their respective emitter current is also made almost equal.

In the case of the transistor constructed in accordance with this invention, the sheet resistance of the base region just below the emitter region is 10640 ohms per square, the sheet resistance of the base region just lead out to the inside of the emitter region is 317 ohms per square and the sheet resistance of the base region just below the conductive area and emitter electrode contact region is 1140 ohms per square.

In addition, in the case of the prior art transistor shown in FIG. 4, the sheet resistance of the base region just below the emitter region is 10640 ohms per square and that of the base region just below the conductive area and emitter electrode contact region is 1140 ohms per square.

Figure 6:
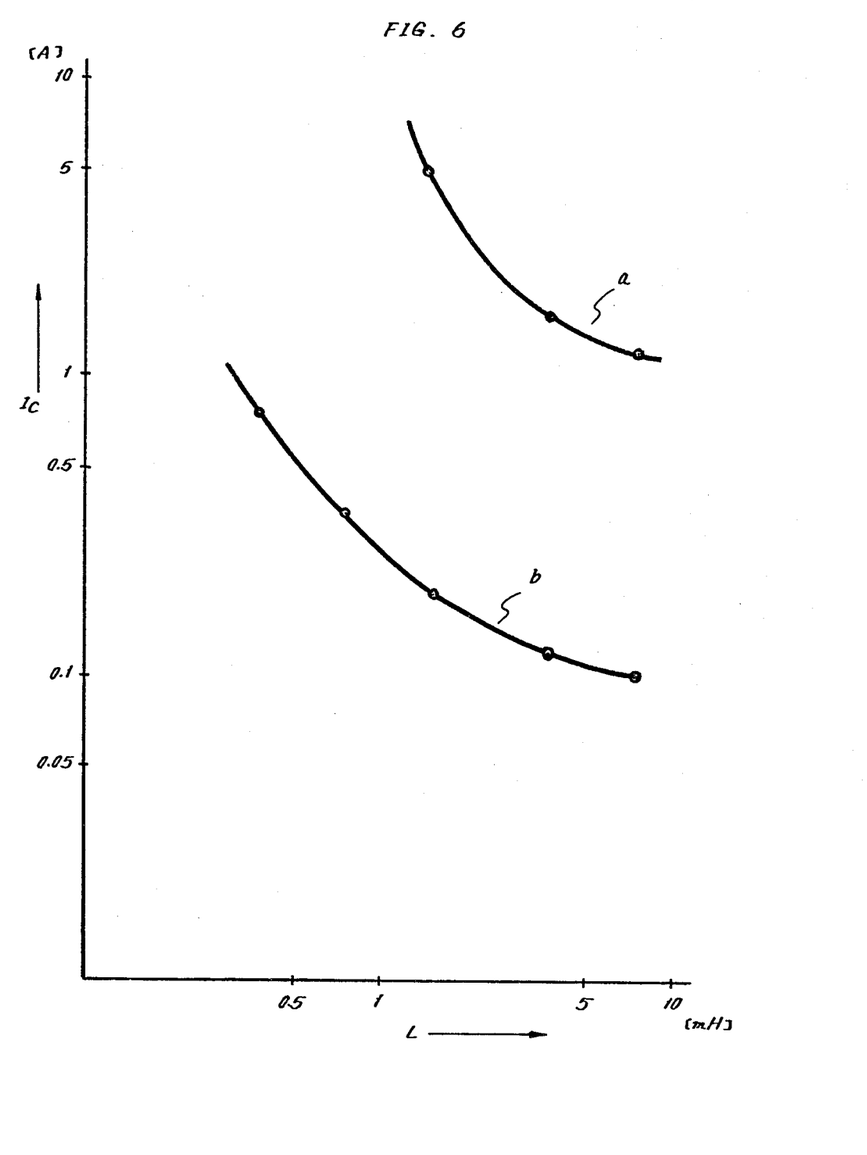
FIG. 6 shows the electrical characteristics of a transistor in accordance with this invention as shown in FIG. 5 and the prior art transistor as shown in FIG. 4.

By measuring the collector current of transistors having differences in their distribution of base resistances with the inductance considered as the load to be changed under the condition that the secondary breakdown is observed during the back biased state, the result as shown in FIG. 6 can be obtained.

In this figure, the curve a shows the load L—secondary breakdown current Ic characteristic of the transistor in accordance with this invention having the basic configuration as shown in FIG. 2, while the curve b shows the load L—secondary breakdown current Ic characteristic of the prior art transistor having the basic configuration as shown in FIG. 4.

As is clear from these results, in case of the transistor in accordance with this invention, the secondary breakdown current value can be made to be 10 to 20 times greater in comparison to that of the prior art transistor and therefore the effect of this invention is very distinctive.

This is because, in the transistor of this invention showing such a distribution of the resistance of the base region, almost all of the current flows in the area having very small sheet resistance (317 ohms per square), namely, the area to which the base region is led out when the transistor changes from its operating region to the cut-off region and, therefore, the current is not concentrated at one small specific area since the potentials at the areas just below the emitter region, emitter electrode contact region, and conductive area become almost the same. On the other hand, in the case of the prior art transistor, the base resistance at the area just below the conductive area and emitter electrode contact region is considerably greater and, therefore, current is concentrated at the area just below the aforementioned emitter electrode contact region.

According to this invention, as described above with regard to the aforementioned embodiment, secondary breakdown during the switching operation can be prevented by the disclosed innovative configuration of the emitter region, conductive area and emitter electrode contact region.

In the embodiment of this invention given above, explanation is made using the ring shape emitter region as the closed loop emitter region at the base region surface. However, it is, of course, understood that such a closed ring shaped emitter region can be formed in a rectangular shape.

Numerous modifications and adaptations of the system of the invention will be apparent to those skilled in the art and thus it is intended by the appended claims to cover all such modifications and adaptations which fall within the true spirit and scope of the invention.

What we claim is:

1. A transistor comprising:
   a collector region and an emitter region both having a first conductivity, and a base region having a second conductivity opposite to said first conductivity, said emitter region arranged in the base region,
   said emitter region shaped as a closed loop so as to provide therein a central region having the same conductivity as said base region,
   an emitter electrode contact portion provided at the approximate center of said central region of said emitter region, and
   at least one narrow conductive area provided within said central region of said emitter region for electrically connecting said emitter region to said emitter electrode contact portion, said at least one narrow conductive area having the same conductivity as said emitter region and a higher resistivity than said emitter region whereby said at least one narrow conductive area operates as a stabilizing resistor for said emitter region.

2. A transistor comprising:
   a collector region and a plurality of emitter regions, each emitter region and the collector region having a first conductivity, and a base region having a second conductivity opposite to said first conductivity, each of said plurality of emitter regions arranged in the base region,
   each of said plurality of emitter regions shaped as a closed loop so as to provide therein a central region having the same conductivity as said base region,
   an emitter electrode contact portion provided at the approximate center of said central region of each of said emitter regions, and
   at least one narrow conductive area provided within said central region of each of said emitter regions for electrically connecting each of said emitter regions to its respective emitter electrode contact portion, said at least one narrow conductive area having the same conductivity as said plurality of emitter regions and a higher resistivity than said plurality of emitter regions whereby said at least one narrow conductive area operates as a stabilizing resistor for each of said plurality of emitter regions.

3. A transistor as in claim 1, wherein said emitter region is toroidally arranged.

4. A transistor as in claim 3, wherein said emitter electrode contact portion is pill shaped and said emitter region and said emitter electrode contact portion are concentrically arranged.

5. A transistor as in claim 1, wherein the depth of said emitter region is greater than the depth of both said emitter electrode contact portion and said at least one narrow conductive area.

6. A transistor as in claim 1, wherein both said emitter electrode contact portion and said at least one narrow conductive area have a lower impurity concentration than said emitter region.

* * * * *